United States Patent
Wheeler et al.

(10) Patent No.: US 6,919,643 B2
(45) Date of Patent: Jul. 19, 2005

(54) MULTI-CHIP MODULE SEMICONDUCTOR DEVICES

(75) Inventors: Nicolas J. Wheeler, Manchester (GB); Philip Rutter, Stockport (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/301,200

(22) Filed: Nov. 21, 2002

(65) Prior Publication Data

US 2003/0098468 A1 May 29, 2003

(30) Foreign Application Priority Data

Nov. 27, 2001 (GB) .............................................. 0128351

(51) Int. Cl.$^7$ ............................................... H01L 29/40
(52) U.S. Cl. ....................................... 257/778; 257/779
(58) Field of Search ............................... 257/778, 687, 257/723, 777, 200, 691, 698, 737

(56) References Cited

U.S. PATENT DOCUMENTS

| | | | |
|---|---|---|---|
| 5,532,512 A | 7/1996 | Fillion et al. | 257/686 |
| 5,604,383 A | 2/1997 | Matsuzaki | 257/778 |
| 5,608,262 A * | 3/1997 | Degani et al. | 257/723 |
| 6,600,220 B2 * | 7/2003 | Barber et al. | 257/685 |

FOREIGN PATENT DOCUMENTS

| | | | |
|---|---|---|---|
| EP | 1043771 | 10/2000 | H01L/23/29 |
| JP | 284523 A | 10/2001 | H01L/25/065 |
| WO | WO0022666 | 4/2000 | H01L/21/60 |

* cited by examiner

Primary Examiner—David Nelms
Assistant Examiner—Thinh T Nguyen
(74) Attorney, Agent, or Firm—Aaron Waxler

(57) ABSTRACT

In a multi-chip module semiconductor device (1), at least one first semiconductor die (20) is mounted on the base portion (11) of a lead-frame (10). A flip chip IC die (30) is mounted by first bump electrodes (31) to electrode contacts (G, S') on the at least one first die (20) and by second bump electrodes (32) to terminal pins (14) of the lead frame. The integrated circuit of the flip chip (30) does not require any lead-frame base-portion area for mounting, and low impedance circuit connections are provided by the bump electrodes (31, 32). The first die (20) may be a MOSFET power switching transistor, with a gate driver circuit in the flip chip (30). The circuit impedance for the switching transistor may be further reduced by having distributed parallel gate connections (G), which may alternate with distributed parallel source connections (S'), and furthermore by having distributed and alternating power supply connections (VCC, GND). The module may comprise two series connected transistors (201, 202) and a control circuit flip chip (300), with bump electrodes (31, 32) and strap connections (181, 182) for providing a dc—dc converter without any wire bonds.

10 Claims, 2 Drawing Sheets

MULTI-CHIP MODULE SEMICONDUCTOR DEVICES

The present invention relates to multi-chip module (i.e. MCM) semiconductor devices, and to methods of making such devices.

In the semiconductor device art, both the expression "chip" and the expression "die" (plural "dice") are used to denote a semiconductor device body. In a MCM device, there is more than one such device body within the device package, i.e. within the module package. Generally, the device includes a lead frame having a base portion and package terminal pins, i.e. parts of the lead frame extend to the outside of the device package to provide device terminals. MCM devices are known in which each semiconductor die is mounted on the lead frame base portion, and connection wires are bonded from die to die and from the dice to terminal pins.

It is an object of the invention to reduce the lead frame area that is needed for die mounting in a MCM device, and also to reduce circuit connection impedance due to the resistance and inductance of the bonded wires.

According to the present invention there is provided a MCM semiconductor device including a lead frame having a base portion and terminal pins, at least one first semiconductor device die that is mounted on the lead frame base portion, and a flip chip integrated circuit semiconductor die that is mounted by first bump electrodes to contacts on the at least one first semiconductor die and by second bump electrodes to lead frame terminal pins.

The device according to the invention as just defined has the advantage that the integrated circuit of the flip chip does not require any lead frame base portion area for mounting, and also has the advantage that low impedance circuit connections are provided by the bump electrodes both from the flip chip to the at least one semiconductor die and from the flip chip to the terminal pins.

In the above-defined device, preferably the lead frame has a slot which separates the lead frame base portion from the lead frame terminal pins to which the second bump electrodes of the flip chip are connected. In this case, making the lead frame may include etching both sides of a metal plate, wherein the etching of one side of the plate provides at least one recess for accommodating the at least one semiconductor die and also provides part of the depth of said slot, and wherein the etching of the other side of the plate provides completion through the plate of said slot.

In a device according to a first preferred embodiment of the invention, there is one said first semiconductor device which is a power transistor, the power transistor being mounted with a first main electrode in electrical contact with a die pad of the lead frame base portion, the die pad being integral with at least one said package terminal pin, the power transistor having a gate electrode electrically connected to at least one said first bump electrode of the flip chip, and the flip chip integrated circuit comprising a gate driver circuit for the power transistor.

In one possible application of this first preferred embodiment, the power transistor and its gate driver circuit may provide part of a dc—dc converter. In this case, the power transistor will be one of two switching transistors which are series connected in the converter, the other switching transistor and a gate driver circuit for the other switching transistor being in a separate module package.

In the device of this first preferred embodiment, preferably the lead frame has a first slot which separates the lead frame base portion from the lead frame terminal pins to which the second bump electrodes of the flip chip are connected, a second main electrode of the power transistor has a main contact on the power transistor die, and an electrical connection, which may be a metal strap, is provided from this main contact to at least one said package terminal pin which is separated from the lead frame base portion by a second slot. In this case, making the lead frame may include etching both sides of a metal plate, wherein the etching of one side of the plate provides a recess for accommodating the power transistor die and also provides part of the depth of said first and second slots, and wherein the etching of the other side of the plate provides completion through the plate of said first and second slots.

In a device according to a second preferred embodiment of the invention there are two said first semiconductor devices which are respectively a first power switching transistor and a second power switching transistor, each power transistor is mounted with a first main electrode in electrical contact with a respective die pad of the lead frame base portion, each die pad being integral with said package terminal pins for the respective first main electrode, a second main electrode of the first power transistor has a main contact on the first power transistor die, a first electrical connection is provided from this second main electrode main contact to the terminal pins for the first main electrode of the second power transistor so as to connect the two power transistors in series, a second main electrode of the second power transistor has a main contact on the second power transistor die, a second electrical connection is provided from this second main electrode main contact to at least one respective isolated said package terminal pin, the flip chip integrated circuit is a control circuit comprising a gate driver circuit for each of the two power transistors, and each of the two power transistors has a gate electrode electrically connected to at least one said first bump electrode of the flip chip. Each of said first and second electrical connections may be a metal strap, and in this case the multi-chip module can be complete without any wire bonds and all the interconnections in the module are of low impedance.

In one possible application of this second preferred embodiment, the two series connected power switching transistors and the flip chip control circuit may provide the active components for a dc—dc converter.

In a device of this second preferred embodiment, preferably the lead frame has a first slot which separates the lead frame base portion from the lead frame terminal pins to which the second bump electrodes of the flip chip are connected, the lead frame has a second slot which separates the two power transistor die pads and which separates the first power transistor die pad from said terminal pins for the first main electrode of the second power transistor, and the lead frame has a third slot which separates the second power transistor die pad from the at least one terminal pin for said second electrical connection. In this case, making the lead frame may include etching both sides of a metal plate, wherein the etching of one side of the plate provides a respective recess for accommodating each power transistor die and also provides part of the depth of said first, second and third slots, and wherein the etching of the other side of the plate provides completion through the plate of said first, second and third slots.

According to an optional feature of the first and second preferred embodiments the circuit impedance of the gate connection (s) can be reduced if the gate electrode of the or each power transistor is distributed to provide more than one gate contact on the or each power transistor die, and if each of the gate contacts is connected to a respective first bump electrode of the flip chip to provide electrically parallel gate connections to the or each gate driver circuit. In this case a further circuit impedance reduction can be achieved if distributed contacts of a second main electrode of the or each power transistor are connected to further first bump electrodes of the flip chip to provide electrically parallel connections from the or each second main electrode to the flip chip integrated circuit, and if the further first bump electrodes for the parallel second main electrode connections are alternately located with respect to the first bump electrodes for the parallel gate connections. By alternating gate and second main electrode connections the inductances of adjacent connections effectively cancel each other out, and the total parasitic inductance between the or each gate driver circuit and the or each power transistor is reduced. This technique for impedance reduction can be extended to the connection for a power supply for the or each gate driver circuit, this power supply being external to the multi-chip module package. In this case the second bump electrodes of the flip chip include at least one set of second bump electrodes providing a distributed connection for at least a first terminal of the power supply for the or each gate driver circuit.

Embodiments of the invention will now be described, by way of example, with reference to the accompanying drawings, in which.

Figure 1:
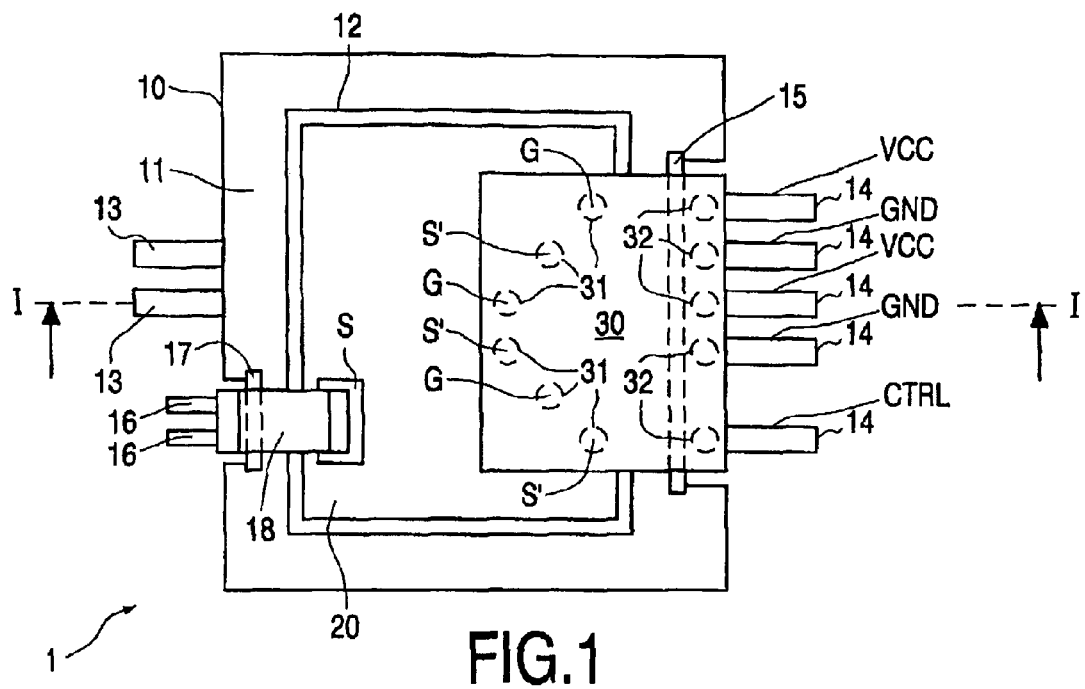
FIG. 1 shows a schematic plan view of a multi-chip module semiconductor device according to a first preferred embodiment of the invention.
Figure 2:
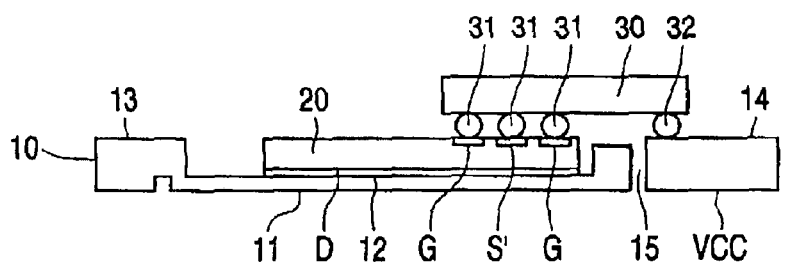
FIG. 2 shows a schematic side-section view of the device of FIG. 1, taken along the line I—I of FIG. 1.

The MCM device of FIGS. 1 and 2, includes a metal lead frame 10, typically of copper, having a base portion 11 with a die pad area 12. A first semiconductor device die 20, which is a vertical MOSFET power switching transistor, is mounted on the lead frame base portion 11 with a first main electrode, that is the drain electrode D, in electrical contact with the die pad 12. The lead frame 10 has package terminal pins 13 which are integral with the die pad 12 and so provide an external terminal for the MOSFET drain electrode D. The terminal pins 13 are arranged to have a top surface level with the top surface, opposite the drain electrode D, of the MOSFET die 20. The lead frame 10 has further package terminal pins 14 which also have a top surface level with the top surface of the MOSFET die 20 and which are separated from the lead frame base portion 11 by a first slot 15. A flip chip integrated circuit semiconductor die 30 is mounted by first bump electrodes 31 of the flip chip 30 being connected to electrode contacts G, S' on the MOSFET die 20 and by second bump electrodes 32 of the flip chip 30 being connected to the isolated terminal pins 14. The flip chip bump electrodes 31, 32 are typically solder balls. The MOSFET power transistor 20 has a gate electrode connected to at least one of the first bump electrodes 31 of the flip chip 30, and the flip chip 30 comprises a gate driver circuit for this power transistor. Having the gate driver circuit in a flip chip 30 bridging the power transistor die 20 and the terminal pins 14, rather than having the gate driver circuit on a separate die pad of the lead frame base portion 11, minimises the area of the lead frame base portion 11 and hence the size of the multi-chip module package.

In the arrangement shown in FIGS. 1 and 2, the power transistor 20 gate electrode is distributed to provide more than one gate contact G on the power transistor die 20, and each of the gate contacts G is connected to a respective first bump electrode 31 of the flip chip 30 to provide electrically parallel gate connections to the gate driver circuit. Furthermore, in the arrangement shown, distributed contacts S of a second main electrode, the source electrode, of the power transistor 20 are connected to further first bump electrodes 31 of the flip chip 30 to provide electrically parallel connections from this second main electrode to the flip chip integrated circuit, and the further first bump electrodes 31 for the parallel second main electrode S' connections are alternately located with respect to the first bump electrodes for the parallel gate connections G. The second bump electrodes 32 include a first set of second bump electrodes providing a distributed connection for a first terminal VCC of an external power supply for the gate driver circuit, the second bump electrodes 32 also include a second set of second bump electrodes providing a distributed connection for a second terminal GND of this power supply, and the second bump electrodes of the first set are alternately located with respect to the second bump electrodes of the second set. A further second bump electrode 32 provides a connection to one of the terminal pins 14 for a control input CTRL of the gate driver circuit.

The source connections S' to the flip chip 30 provide a small gate-source loop, low impedance equating to fast switching, and also keep the gate-source circuit separate from the main device current carried via the drain-source circuit, which could cause disturbances to the gate driver. This drain-source circuit is provided by the second main electrode, the source electrode, of the power transistor 20 having a main contact S on the power transistor die 20, as shown in FIG. 1, with an electrical connection 18 in the form of a metal strap provided from this main contact S to a least one package terminal pin 16 which is separated from the lead frame base portion 11 by a second slot 17. The strap 18 has one end portion which is soldered or glued to the contact S, another end portion which is soldered or glued to the terminal pins 16 and a middle portion which bridges over the second slot 17.

The lead frame 10 including a recessed base portion 11 for accommodating the power transistor die 20, the integral pins 13 and the pins 14 and 16 with respective isolating first and second slots 15, 17 may be made by a conventional mechanical method such as stamping a sheet of metal. However, as illustrated by the form of the lead frame shown in FIG. 2, a preferred method of making the lead frame 10 includes etching both sides of a metal plate. The etching of one side of the plate provides a die pad recess 12 for accommodating the power transistor die 20 and also provides part of the depth of the first 15 and second 17 slots, and the etching of the other side of the plate provides completion through the plate of the first 15 and second 17 slots. The etching of one side of the plate and the etching of the other side of the plate may be performed in separate stages. Otherwise, it is possible to use a patterned mask on both sides of the plate and etch both sides at once.

Figure 3:
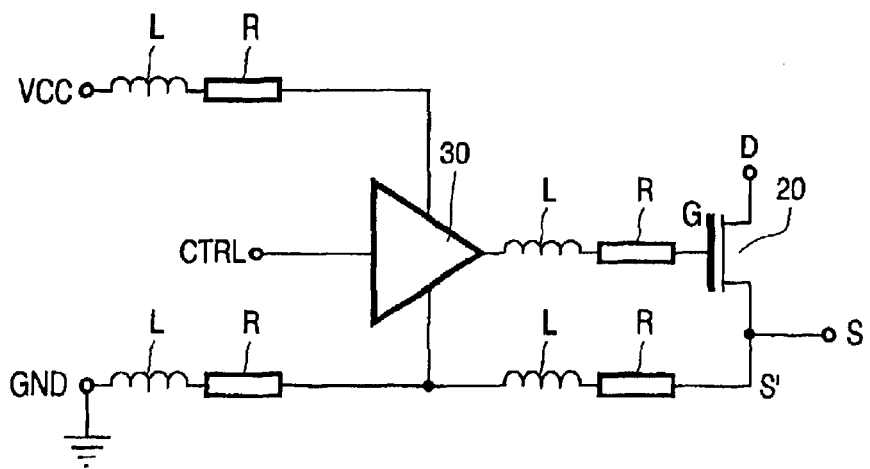
FIG. 3 shows an example of a circuit, known per se, for which the module configuration of FIGS. 1 and 2 is suitable.

Referring now to FIG. 3, there is shown a circuit diagram for the multi-chip module of FIGS. 1 and 2 including the MOSFET power switching transistor 20, the flip chip gate driver circuit 30, and the main device D and source S terminals. This diagram shows the circuit connection impedance, that is resistance R and parasitic inductance L, of the driver-gate-source circuit which limits the speed of charging and discharging of the gate capacitance and hence the switching speed of the power transistor. This circuit connection impedance R, L is shown as the impedance of the connections between the gate driver circuit 30 and the power supply terminals VCC and GND, and also the impedance of the connections between the gate driver circuit 30 and the gate G and source S' electrode terminals of the MOSFET transistor 20. Each of these connections is a flip chip bump electrode connection which has low impedance compared with a with a wire bond connection, the parallel distribution of each of these connections further reduces the resistance component of the connection impedance, and furthermore the parasitic inductance of these connections is reduced by the alternating location of the gate and source connections G and S' and also by the alternating location of the power connections VCC and GND.

Figure 4:
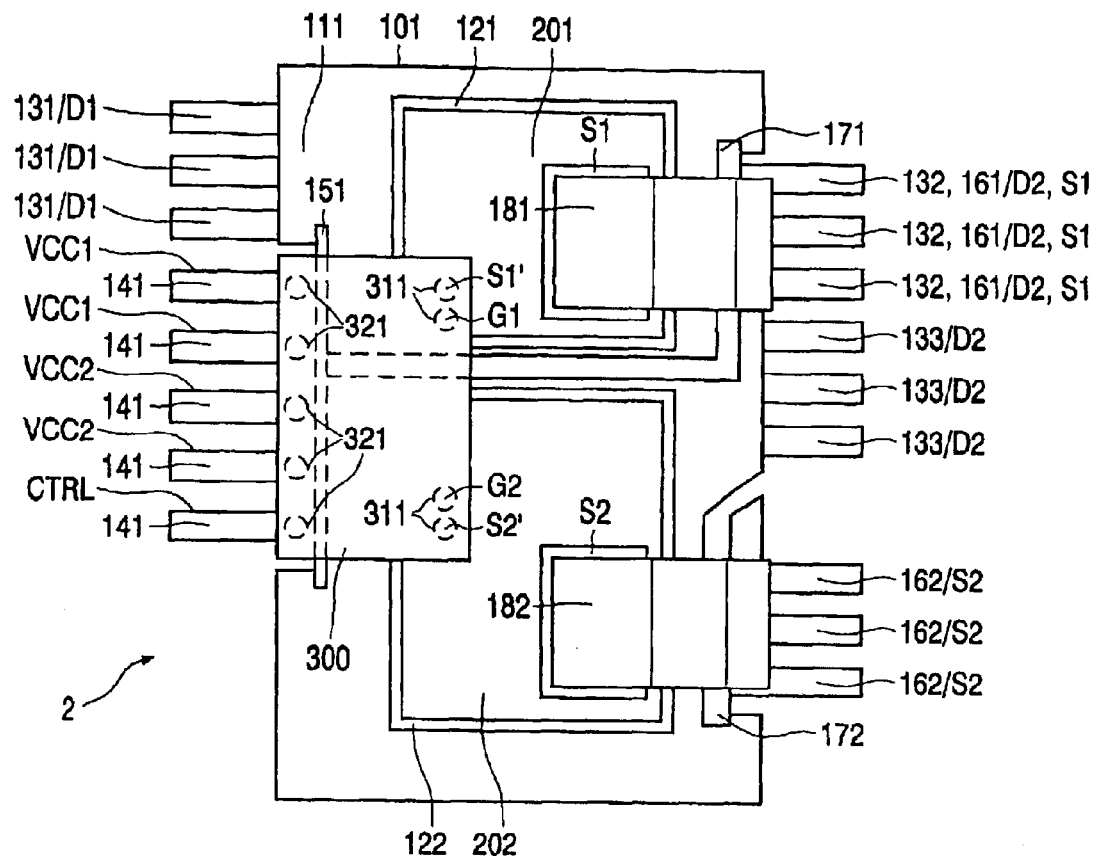
FIG. 4 shows a schematic plan view of a multi-chip module semiconductor device according to a second preferred embodiment of the invention.

Referring now to FIG. 4, a multi-chip module semiconductor device 2 includes a metal lead frame 101 having a base portion 111 with two die pad areas 121 and 122. A first semiconductor device die 201, which is a first vertical MOSFET power switching transistor, is mounted on the lead frame base portion 111 with a first main electrode, that is its drain electrode D1, in electrical contact with the die pad 121. A second semiconductor device 202, which is a second vertical MOSFET power switching transistor, is mounted on the lead frame base portion 111 with a first main electrode, that is its drain electrode D2, in electrical contact with the die pad 122. A slot 171 in the lead frame base portion 111 isolates the die pad 121 from the die pad 122. The lead frame 101 has package terminal pins 131/D1 which are integral with the die pad 121 and so provide an external terminal for the MOSFET drain electrode D1. The terminal pins 131/D1 are arranged to have a top surface level with the top surface, opposite the drain electrode D1, of the MOSFET die 201. The lead frame 101 has further package terminal pins 132, 161/D2, S1 and 133/D2 which are integral with the die pad 122 and so provide an external terminal for the MOSFET drain electrode D2. The terminal pins 132, 161/D2, S1 and 133/D2 also have a top surface level with the top surface of the MOSFET die 201 and with the top surface of the MOSFET die 202. The slot 171 also separates the first transistor die pad 121 from the terminal pins 132, 161/D2, S1 and 133/D2.

A main contact S1 for a second main electrode, the source electrode, of the first power transistor is provided on the top surface of the MOSFET die 201, opposite the drain electrode D1. A first electrical connection 181, in the form of a metal strap, typically of copper, is provided from the main source contact S1 of the first power transistor 201 to the terminal pins 132, 161/D2, S1 for the drain electrode D2 of the second power transistor 202 so as to connect the two power transistors in series. The strap 181 has one end portion which is soldered or glued to the main contact S1, another end portion which is soldered or glued to the terminal pins 132, 161/D2, S1 and a middle portion which bridges over the slot 171. A main contact S2 for a second main electrode, the source electrode, of the second power transistor is provided on the top surface of the MOSFET die 202, opposite the drain electrode D2. A second electrical connection 182, in the form of a metal strap, typically of copper, is provided from the main source contact S2 of the second power transistor 202 to package terminal pins 162/S2 which are separated from the base portion 111 of the lead frame by a slot 172. The strap 182 has one end portion which is soldered or glued to the main contact S2, another end portion which is soldered or glued to the terminal pins 162/S2 and a middle portion which bridges over the slot 172.

The lead frame 101 has further package terminal pins 141 which also have a top surface level with the top surface of both the MOSFET die 201 and the MOSFET die 202 and which are separated from the lead frame base portion 111 by a slot 151 which connects with the slot 171.

A flip chip integrated circuit semiconductor die 300 is mounted by first bump electrodes 311 of the flip chip 300 being connected to at least one gate electrode contact G1 and at least one source electrode contact S1' on the MOSFET die 201 and to at least one gate electrode contact G2 and at least one source electrode contact S2' on the MOSFET die 202, and by second bump electrodes 321 of the flip chip 300 being connected to the isolated terminal pins 141. The flip chip bump electrodes 311, 321 are typically solder balls. The MOSFET power transistor 201 has a gate electrode connected to at least one of the first bump electrodes 311 of the flip chip 300, the MOSFET power transistor 202 has a gate electrode connected to at least one of the first bump electrodes 311 of the flip chip 300, and the flip chip integrated circuit is a control circuit comprising a gate driver circuit for each of the two power transistor 201 and 202.

In the same manner as described for the arrangement of FIGS. 1 and 2, each power transistor 201, 202 gate electrode may be distributed to provide more than one gate connection contact G1, G2 on the respective transistor die 201, 202 to provide electrically parallel gate connections to the gate driver circuit for the respective transistor 201, 202. Also the power transistor 201, 202 source electrodes may be distributed to provide more than one source connection contact S1', S2' on the transistor dice 201, 202 to provide electrically parallel source connections to the gate driver circuits for the transistors 201, 202. The second bump electrodes 321 include a first set of second bump electrodes providing a distributed connection for a first terminal VCC1 of a power supply for the gate driver circuit for the transistor 201, and the second bump electrodes 321 also include a second set of second bump electrodes providing a distributed connection for a first terminal VCC2 of a power supply for the gate driver circuit for the transistor 202. A further second bump electrode 321 provides a connection to one of the terminal pins 141 for a control input CTRL of the control circuit.

Figure 5:
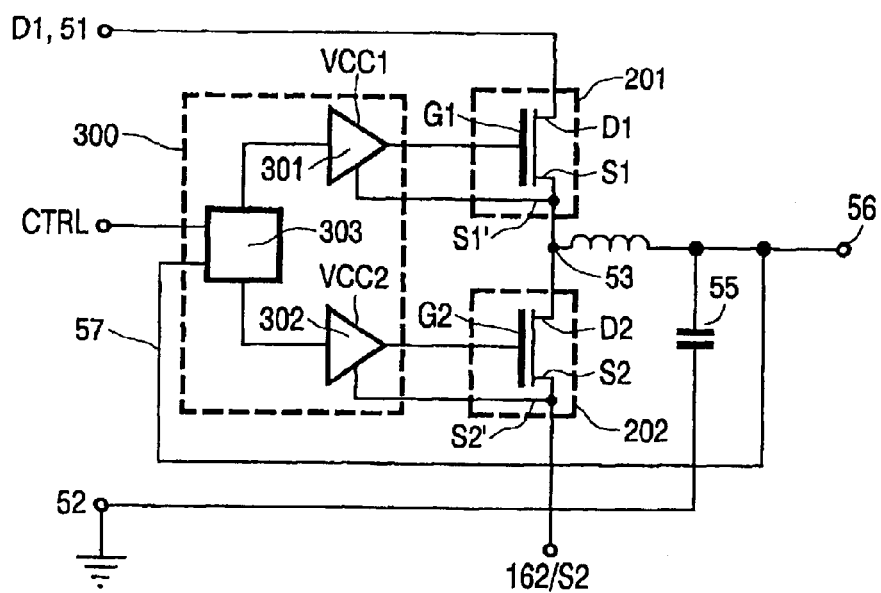
FIG. 5 shows an example of a circuit, known per se, for which the module configuration of FIG. 4 is suitable.

Referring now to FIG. 5, there is shown a circuit diagram for the multi-chip module of FIG. 4 including the MOSFET power switching transistors 201 and 202 and the flip chip control circuit 300. This multi-chip module provides the active components of a dc—dc converter. A voltage is applied between terminals 51, 52 between which the MOSFET transistors 201 and 202 are connected in series. The node between the transistors 201 and 202 is a switch node 53 which feeds through an inductor 54 and across a capacitor 55 to an output 56. The transistors 201 and 202 are driven by respective gate driver circuits 301 and 302. A control circuit 303 has one input on an input control terminal CTRL and another input fed from the output 56 via a feedback path 57. The control circuit 303 supplies control signals to control the transistors 201, 202 to maintain a constant voltage at the output by switching these transistors off and on alternately. The mark-space ratio is varied, i.e. the ratio of time for which the transistor 201 conducts to the time the transistor 202 conducts is modulated, to achieve the desired voltage on the output 56.

In the above-described embodiments, the power transistors 20, 201 and 202 have been designated as vertical MOSFETs. These transistors could be another type of insulated gate transistor such as an IGBT. The circuits shown in FIGS. 3 and 5 are known per se and serve only to illustrate typical applications of the module configurations exemplified by FIGS. 1 and 2 and by FIG. 4. These module configurations could be used for circuit applications other than dc—dc converters, for example for class D amplifiers. Indeed, within the scope of the invention, instead of having one or more power transistors mounted on the base portion of the lead frame with the flip chip including one or more gate driver circuits, the at least one semiconductor device die mounted on the lead frame base could be another type of main semiconductor device and the flip chip could include a suitable interface circuit for that main semiconductor device.

What is claimed is:

1. A multi-chip module semiconductor device including a lead frame having a base portion and package terminal pins, at least one first semiconductor device die that is mounted on the lead frame base portion, and a flip chip integrated circuit semiconductor die that is mounted by first bump electrodes to contacts on the at least one first semiconductor die and by second bump electrodes to terminal pins of said lead frame, wherein there is one said first semiconductor device which is a power transistor, the power transistor being mounted with a first main electrode in electrical contact with a die pad of the lead frame base portion, the die pad being integral with at least one said package terminal pin, the power transistor having a gate electrode electrically connected to at least one said first bump electrode of the flip chip, and the flip chip integrated circuit comprising a gate driver circuit for the power transistor.

2. A device as claimed in claim 1, wherein the lead frame baa a first slot which separates the lead frame base portion from the lead frame terminal pins to which the second bump electrodes of the flip chip are connected, wherein a second main electrode of the power transistor has a main contact on the power transistor die, and wherein an electrical connection is provided from this main contact to at least one said package terminal pin which is separated from the lead frame base portion by a second slot.

3. A device as claimed in claim 2, wherein said electrical connection is a metal strap.

4. A multi-chip module semiconductor device including a lead frame having a base portion and package terminal pins, at least one first semiconductor device die that is mounted on the lead frame base portion, and a flip chip integrated circuit semiconductor die that is mounted by first bump electrodes to contacts on the at least one first semiconductor die and by second bump electrodes to terminal pins of said lead frame, wherein there are two said first semiconductor devices which are respectively a first power switching transistor and a second power switching transistor, wherein each power transistor is mounted with a first main electrode in electrical contact with a respective die pad of the lead frame base portion, each die pad being integral with said package terminal pins for the respective first main electrode, wherein a second main electrode of the first power transistor has a main contact on the first power transistor die, wherein a first electrical connection is provided from this second main electrode main contact to the terminal pins for the first main electrode of the second power transistor so as to connect the two power transistors in series, wherein a second main electrode of the second power transistor has a main contact on the second power transistor die, wherein a second electrical connection is provided from this second main electrode main contact to at least one respective isolated said package terminal pin, wherein the flip chip integrated circuit is a control circuit comprising a gate driver circuit for each of the two power transistors, and wherein each of the two power transistors has a gate electrode electrically connected to at least one said first bump electrode of the flip chip.

5. A device as claimed in claim 4, wherein each of said first and second electrical connections is a metal strap.

6. A device as claimed in claim 4, wherein the lead frame has a first slot which separates the lead frame base portion from the lead frame terminal pins to which the second bump electrodes of the flip chip are connected, wherein the lead frame has a second slot which separates the two power transistor die pads and which separates the first power transistor die pad from said terminal, pins for the first main electrode of the second power transistor, and wherein the lead frame has a third slot which separates the second power transistor die pad from the at least one terminal pin for said second electrical connection.

7. A device as claimed in claim 1, wherein the gate electrode of the or each power transistor is distributed to provide more than one gate contact on the or each power transistor die, and wherein each of the gate contacts is connected to a respective first bump electrode of the flip chip to provide electrically parallel gate connections to the or each gate driver circuit.

8. A device as claimed in claim 7, wherein distributed contacts of a second main electrode of the or each power transistor are connected to further first bump electrodes of the flip chip to provide electrically parallel connections from the or each said second main electrode to the flip chip integrated circuit, and wherein the further first bump electrodes for the parallel second main electrode connections are alternately located with respect to the first bump electrodes for the parallel gat connections.

9. A device as claimed in claim 1, wherein said second bump electrodes include at least one set of second bump electrodes providing a distributed connection for at least a first terminal of a power supply for the or each sate driver circuit.

10. A device as claimed in claim 1, in which the or each power transistor is a vertical MOSFET.

* * * * *